United States Patent
Yoo

(10) Patent No.: US 8,749,014 B2
(45) Date of Patent: Jun. 10, 2014

(54) SCHOTTKY DIODES WITH DUAL GUARD RING REGIONS AND ASSOCIATED METHODS

(75) Inventor: Ji-Hyoung Yoo, Cupertino, CA (US)

(73) Assignee: Monolithic Power Systems, Inc., San Jose, CA (US)

(*) Notice: Subject to any disclaimer, the term of this patent is extended or adjusted under 35 U.S.C. 154(b) by 363 days.

(21) Appl. No.: 13/226,846

(22) Filed: Sep. 7, 2011

(65) Prior Publication Data
US 2012/0056294 A1 Mar. 8, 2012

Related U.S. Application Data

(60) Provisional application No. 61/380,655, filed on Sep. 7, 2010.

(51) Int. Cl.
*H01L 29/872* (2006.01)
*H01L 21/329* (2006.01)

(52) U.S. Cl.
USPC ............ 257/484; 257/E29.338; 257/E21.359; 438/570

(58) Field of Classification Search
USPC ................. 257/127, 170, 409, 452, 484, 605, 257/E29.012, E29.013; 438/570
See application file for complete search history.

(56) References Cited

U.S. PATENT DOCUMENTS 7,348,643 B2 * 3/2008 Boselli et al. ................. 257/409
2011/0156199 A1 6/2011 Yoo et al.

OTHER PUBLICATIONS

U.S. Appl. No. 12/980,143, filed Dec. 28, 2010, Tiesheng.
U.S. Appl. No. 13/215,116, filed Aug. 22, 2011, Don.

* cited by examiner

*Primary Examiner* — Matthew W Such
*Assistant Examiner* — Monica D Harrison
(74) *Attorney, Agent, or Firm* — Perkins Coie LLP

(57) ABSTRACT

The present invention discloses a Schottky diode. The Schottky diode comprises a cathode region, an anode region and a guard ring region. The anode region may comprise a metal Schottky contact. The guard ring region may comprise an outer guard ring and a plurality of inner guard stripes inside the outer guard ring. And wherein the inner guard stripe has a shallower junction depth than the outer guard ring.

20 Claims, 5 Drawing Sheets

SCHOTTKY DIODES WITH DUAL GUARD RING REGIONS AND ASSOCIATED METHODS

CROSS-REFERENCE TO RELATED APPLICATION(S)

This application claims the benefit of U.S. provisional application No. 61/380,655, filed on Sep. 7, 2010, and incorporated herein by reference.

TECHNICAL FIELD

The present technology generally relates to semiconductor device, and more particularly relates to Schottky diodes.

BACKGROUND

When a metal layer contacts with a lightly doped semiconductor material, a contact effect comparable to a PN-junction appears. It is called the Schottky contact. This effect is used to make Schottky diode. When forward biased, a Schottky diode is in an "on" state and current flows through the diode. When the diode is reversely biased, a Schottky diode is in an "off" state and ideally current will not flow. However, Schottky diodes are not ideal, and thus will experience a small amount of reverse leakage current. Reverse leakage is detrimental to the performance of a circuit and results in a loss of power in the circuit. The breakdown voltage of a Schottky diode is the maximum amount of voltage that may be applied to the diode before the diode begins to breakdown. Accordingly, a Schottky diode for high-voltage applications with low reverse leakage current and high forward current drivability is desired.

FIG. 1 shows a conventional Schottky diode 100. The electrical field between the Schottky contact 12 and the semiconductor material 11 needs to be minimized for reducing reverse current and achieving higher breakdown voltage. Accordingly, the conventional high voltage Schottky diode 100 adopts deep and lightly doped P-type ring 15 as a guard ring region to reduce the high electrical field near the Schottky contact 12.

FIG. 2 shows a layout diagram of the conventional Schottky diode 100 as shown in FIG. 1. Cathode contact region 14 is laid at the edge of the diode 100 and the guard ring region 15 is laid out at the periphery of the metal Schottky contact 12. For the conventional Schottky diode 100, deep guard ring region 15 is required to substantially reduce the electric field near the metal Schottky contact. However, deep guard ring region 15 consumes large area, and the integrating density is poor.

Accordingly, improved devices are desired to address the above deficiencies.

SUMMARY

In one embodiment, a Schottky diode comprises a cathode region, an anode region and a dual guard ring region. Wherein the anode region may comprise a metal Schottky contact. Wherein the guard ring region may comprise an outer guard ring region and a plurality of inner guard stripes inside the outer guard ring, and wherein the inner guard stripe may have a shallower junction depth than the outer guard ring.

BRIEF DESCRIPTION OF THE DRAWINGS

Non-limiting and non-exhaustive embodiments are described with reference to the following drawings. The drawings are only for illustration purpose. Usually, the drawings only show part of the devices of the embodiments. These drawings are not necessarily drawn to scale. The relative sizes of elements illustrated by the drawings may differ from the relative size depicted.

The use of the same reference label in different drawings indicates the same or like components.

DETAILED DESCRIPTION

The following description provides a description for exemplary embodiments of the technology. One skilled in the art will understand that the technology may be practiced without some or all of the features described herein. In some instances, well known structures and functions have not been shown or described in detail to avoid unnecessarily obscuring the description of the embodiments of the technology. In some instances, similar structures and functions that have been described in detail for other embodiments are not been described in detail for such embodiments to simplify and make clear understanding of the embodiments. It is intended that the terminology used in the description presented below be interpreted in its broadest reasonable manner, even though it is being used in conjunction with a detailed description of certain embodiments of the technology.

Figure 3:
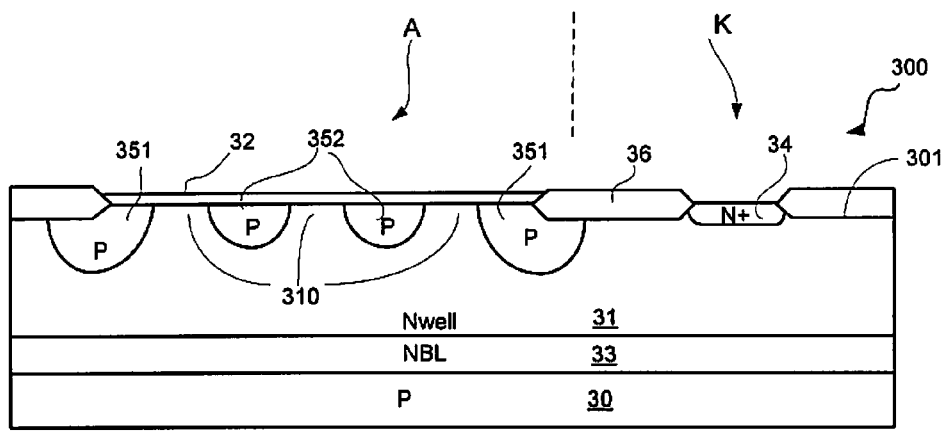
FIG. 3 shows a semiconductor device comprising a Schottky diode with dual guard ring regions according to an embodiment of the present invention.

FIG. 3 shows a semiconductor device 300 comprising a Schottky diode with dual guard ring regions according to an embodiment of the present invention. The semiconductor device 300 is manufactured by forming a first guard ring region and forming a second guard ring region, wherein the first guard ring region encloses the second guard ring region. With the dual guard ring regions, the reverse leakage current may decrease and breakdown voltage may improve.

The Schottky diode 300 comprises a semiconductor substrate 30, an N-type semiconductor layer 31, a Schottky contact 32, a cathode contact region 34 and a guard ring region. The guard ring region comprises an outer guard ring region 351 (or first guard ring region) and an inner guard ring region 352 (or second guard ring region), and the inner guard ring region 352 has a shallower depth than the outer guard ring region 351. In a preferred embodiment, the outer guard ring region 351 and the inner guard ring region 352 contact each other and the guard ring region comprises an integral region. In another embodiment, the outer guard ring region 351 and the inner guard ring region 352 are separate regions and a guard ring region may comprise a plurality of P-type doped regions. The N-type semiconductor layer 31 is formed on the semiconductor substrate 30. The guard ring region (351, 352) and the cathode contact region 34 are formed in the semiconductor layer 31. The metal Schottky contact 32 is formed over the guard ring region (351, 352) and overlaps the semiconductor layer 31 and the guard ring region (351, 352). In the shown embodiment in FIG. 3, the device further comprises an N-type buried layer (NBL) 33 between the semiconductor substrate 30 and the N-type semiconductor layer 31. The NBL layer has a higher doping concentration than the semiconductor layer 31. In some other embodiments, the NBL layer is not essential. In the shown embodiment in FIG. 3, the device further comprises a field oxide 36 between the Schottky contact 32 and the cathode contact region 34. In other embodiment, the field oxide 36 is replaced with other dielectric materials. In one embodiment, the semiconductor substrate and the NBL layer are referred to as a semiconductor substrate. The shown semiconductor substrate as shown in FIG. 3 is P type. However, other type of material can be adopted as the semiconductor substrate 30.

From another view, Schottky diode 300 comprises an anode region, a cathode regions and a guard ring region (351, 352). The anode region comprises the metal Schottky contact 32 and a Schottky interface 310. The metal Schottky contact 32 is formed above the top surface 301 of the semiconductor layer 31. The region(s) of the semiconductor layer 31 near the top surface 301 and covered by the metal Schottky contact 32 comprises the Schottky interface 310. In the shown embodiment in FIG. 3, P-type guard ring region comprises the outer guard ring region 351 and inner guard ring region 352 formed in the N type semiconductor layer 31 near the Schottky contact 32. At the cathode region, a highly doped N-type cathode contact region 34 is formed from the top surface 301 in the semiconductor layer 31. The cathode region may further comprise a metal layer formed above the cathode contact region 34.

Between the anode region and the cathode region, a field oxide 36 is formed at the top surface 301 of the semiconductor device 300 to isolate the anode region and the cathode region.

Referring again to anode region, in one embodiment, the Schottky contact is Titanium and the semiconductor layer 31 is a lightly doped semiconductor material. In one embodiment, the semiconductor material is Silicon. For the embodiment shown in FIG. 3, the semiconductor layer 31 is a lightly doped N well. In one embodiment, the semiconductor layer 31 may be doped with a plurality of doping concentration levels. Besides, the thickness of the semiconductor layer 31 can be controlled to adjust the breakdown voltage of the Schottky diode 300. The thicker the semiconductor layer 31, the higher the break down voltage is. However, a thicker semiconductor layer 31 may lower down the current drivability of the Schottky diode.

Continuing with FIG. 3, the outer guard ring region 351 is deeper than the inner guard ring region 352. A higher breakdown voltage may be achieved when the Schottky diode 300 has a deeper outer guard ring region 351. Thus in one embodiment, the breakdown voltage of Schottky diode 300 can be adjusted by controlling the depth of the outer guard ring region 351. The outer guard ring region 351 encloses the inner guard ring region 352. The inner guard ring region 352 comprises multiple inner guard stripes 352 and is enclosed by outer guard ring region 351. Since inner guard ring region 352 is doped with a shallower junction depth than outer guard ring region 351, inner guard ring region 352 allows a narrower shape than outer guard ring region 351. The shallow inner guard ring stripes may achieve a high forward current drivability for the Schottky diode 300. And the narrow inner guard ring stripes may achieve a high integration density by placing the inner guard stripes 352 closely. Inner guard stripes 352 may be placed closer to further lower down the reverse leakage current. With appropriate layout configuration of outer guard ring region 351 and inner guard ring region 352, the size of the anode region may be reduced for a predetermined breakdown voltage or a predetermined current carrying ability.

Figure 4:
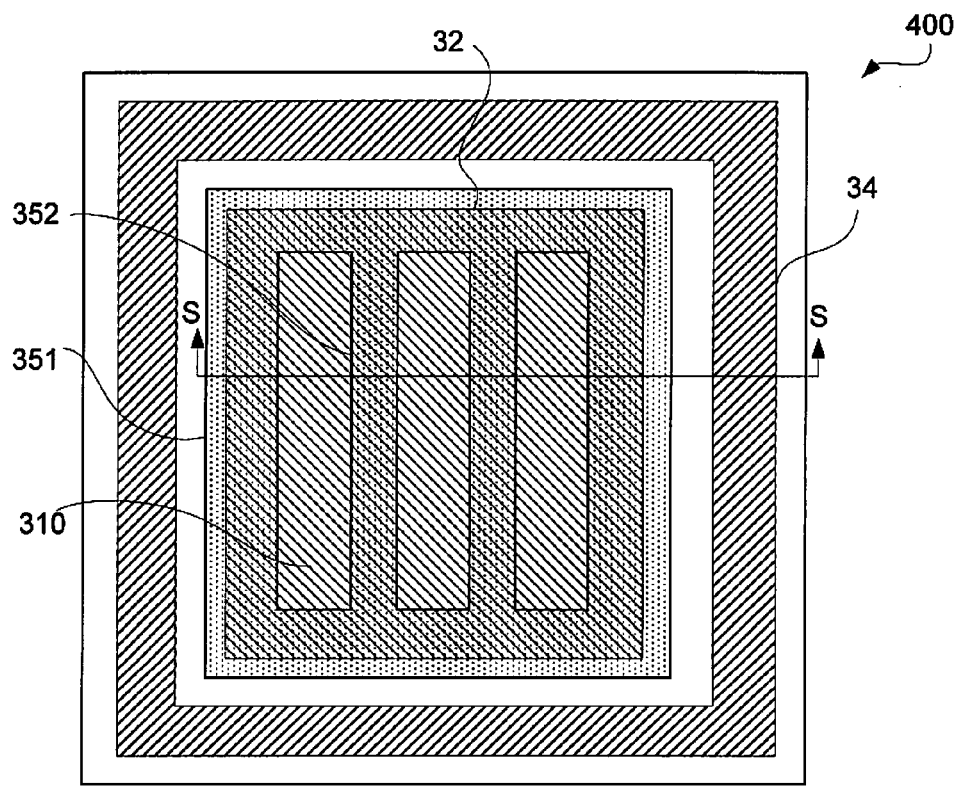
FIG. 4 illustrate a layout diagram of a Schottky diode 400 according to an embodiment of the present invention.

FIG. 4 illustrates a layout diagram of a Schottky diode 400 according to an embodiment of the present invention. In one embodiment, Schottky diode 400 represents the layout diagram of Schottky diode 300 in FIG. 3 where the sectional diagram of FIG. 3 is diced from the line of S-S in FIG. 4. Referring to FIG. 4, the pattern filled with up-right diagonal lines represents the cathode region 34 or the cathode contact region; the pattern filled with uniform dots represents the guard ring region; and the translucent pattern filled with up-left diagonal lines represents the Schottky contact 32. The guard ring region comprises the outer guard ring region 351 and the inner guard ring region 352. In the shown embodiment, the guard ring region (351, 352) is in lattice pattern where the outer guard ring region 351 comprising a closed ring shape encloses an array of parallel inner guard stripes 352. In the shown embodiment, an inner guard stripe 352 has a narrower width than the outer guard ring stripe 352. And the narrower width implies a shallower junction depth. The cathode region 34 encloses the guard ring region (351, 352). In another embodiment, the cathode contact region 34 is outside of the guard ring region (351, 352) and may partly enclose the guard ring region from the top plane view of a semiconductor die. Schottky contact 32 covers over the most part of the guard ring region (351, 352) where the outer guard ring region 351 is at the edge of Schottky contact 32. The complementary region(s) of the guard ring region (351, 352) beneath the metal Schottky contact 32 comprises Schottky interface 310. The layout pattern of the Schottky diode 400 shows that the Schottky interface 310 intervenes with the guard ring region (351, 352). The term of "intervene" means that at least one direction can be found from a top plane view of a semiconductor device and when dicing the semiconductor device in this direction, three or more guard ring stripes including outer guard ring stripes 351 and inner guard ring stripes 352 can be found. In the shown embodiment of FIG. 4, the guard ring region (352, 351) is in lattice pattern and when dicing the semiconductor device 400 from the direction of S-S, four inner guard ring stripes (352, 351, 351 and 352 in sequence) are found, referring to FIG. 3. The inner guard ring region 351 comprises a plurality of stripes such that Schottky interface 310 is divided into a plurality of Schottky interface regions.

Figure 5A:
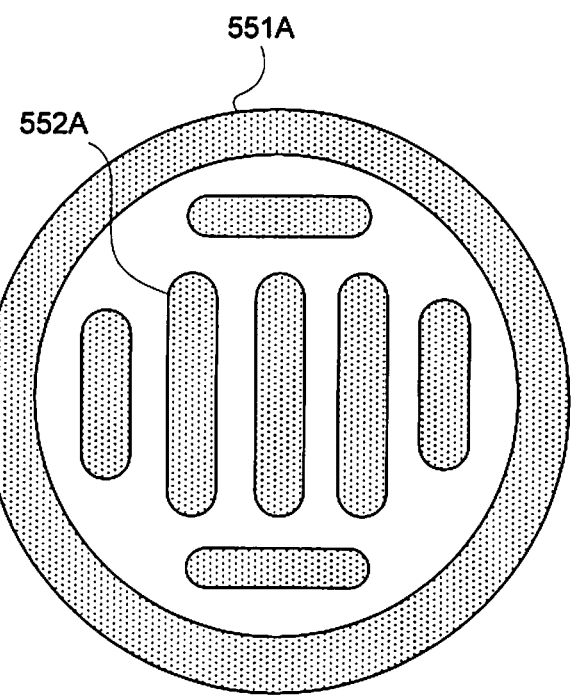
FIG. 5A shows a guard ring region of a Schottky diode according to an embodiment of the present invention.

In some other embodiments, the guard ring region can have various other patterns such that the outer guard ring region encloses the inner guard ring region, and the Schottky interface is configured to intervene with the guard ring region. For example, from a top plane view, in one embodiment as shown in FIG. 5A, an outer guard ring region 551A is in a circle pattern enclosing the inner guard ring region 552A, wherein the inner guard ring region 552A comprises a plurality of discrete stripes.

Figure 5B:
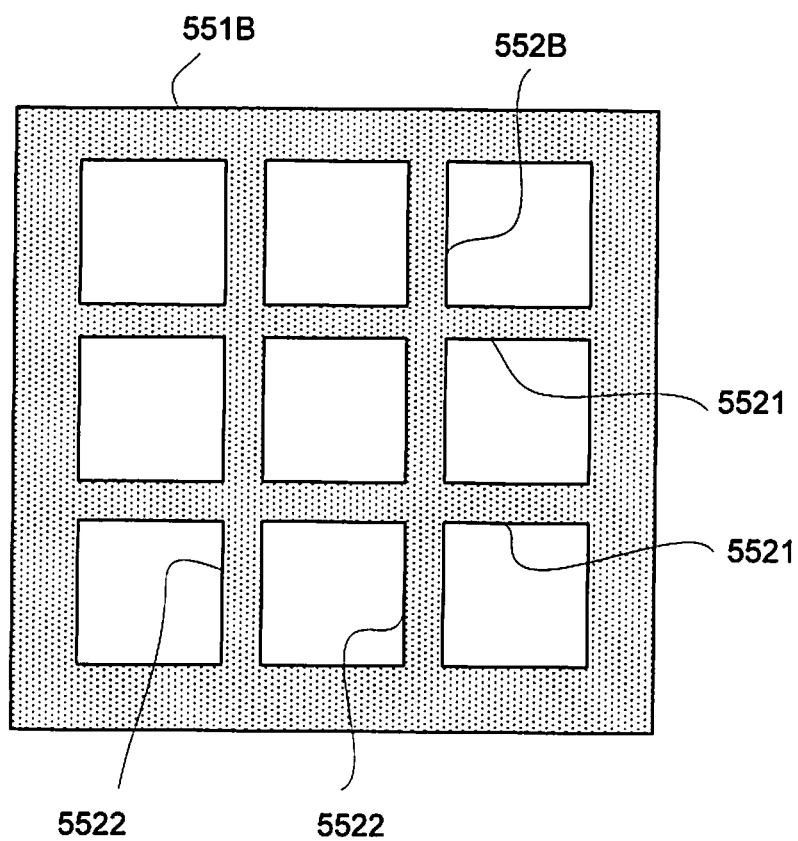
FIG. 5B shows a guard ring region according to another embodiment of the present invention.

Then referring to the embodiment shown in FIG. 5B, the guard ring region comprising an outer guard ring region 551B and an inner guard ring region 552B has a grid shape where the inner guard ring region 552B comprises a plurality of lateral inner guard stripes 5521 and a plurality of vertical inner guard stripes 5522 and the outer guard ring region 551B comprising a closed ring shape encloses the inner guard ring region 552B.

Figure 6:
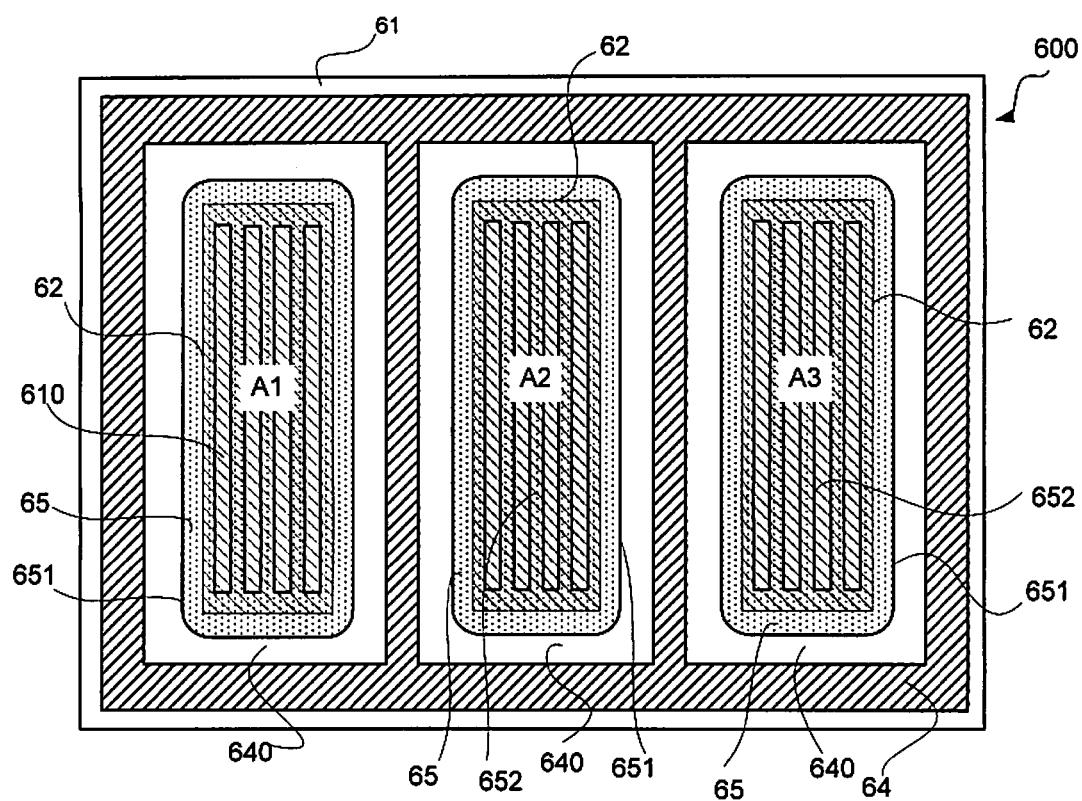
FIG. 6 illustrates a layout diagram of a Schottky diode 600 where the cathode region is in lattice pattern according to an embodiment of the present invention.

FIG. 6 illustrates a layout diagram of a Schottky diode 600 according to an embodiment of the present invention. The Schottky diode 600 comprises a cathode region 64 represented by pattern filled with up-right diagonal lines, a plurality of guard ring regions 65 represented by pattern filled with uniform dots, a plurality of metal Schottky contacts 62 represented by pattern filled with up-left diagonal lines and a semiconductor layer 61 represented by a blank pattern. The cathode region 64 may comprise cathode contact region and a metal layer formed above the cathode contact region. The cathode region 64 of Schottky diode 600 is placed more often in a lattice pattern having a plurality of windows 640, and each guard ring region 65 is formed in one window 640 of the lattice pattern. In this configuration, the anode of Schottky diode 600 is separated into a plurality of anode region islands A1, A2 and A3. Each anode region island A1, A2 or A3 comprises a metal Schottky contact 62. Each metal Schottky contact 62 is formed over one guard ring region 65 and overlaps semiconductor layer 61. Each guard ring region 65 in FIG. 6 is in lattice pattern and comprises multiple inner guard stripes 652. In one embodiment, the cathode region has other pattern in a configuration that the anode is divided into multiple anode islands, for example, the cathode region is in a grid shape. And in another embodiment, the cathode region partly encloses the anode islands. In some embodiments, the depth of the outer guard ring region may be controlled to achieve a desired break down voltage. And in some embodiments, the space among the inner guard stripes 652 may be controlled to achieve a desired current drivability and/or the reverse leakage current.

Figure 7:
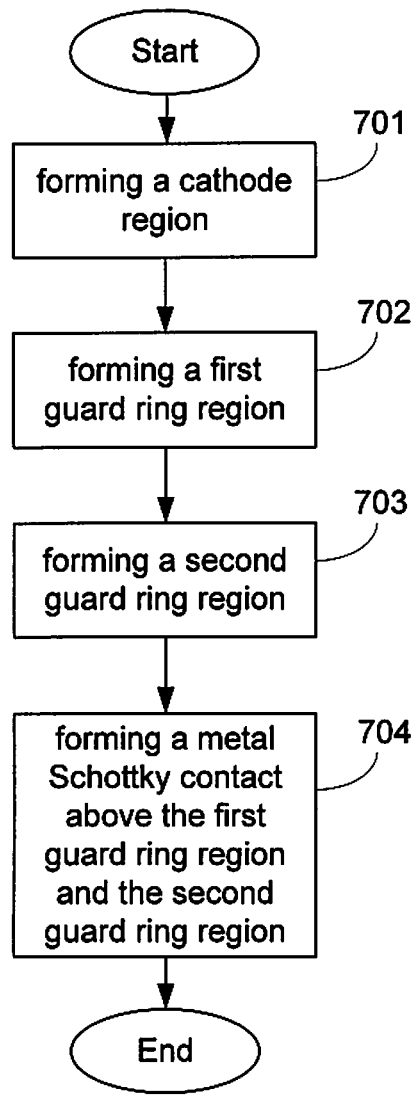
FIG. 7 illustrates a method of manufacturing a Schottky diode according to an embodiment of the present invention.

FIG. 7 illustrates a method of manufacturing a Schottky diode with dual guard ring regions according to an embodiment of the present invention. The method comprises manufacturing a cathode region in step 701. Step 701 may comprise manufacturing an N-type cathode contact region in an N-type semiconductor layer, where the N-type cathode contact region has a higher doping concentration than the N-type semiconductor layer. And the method of manufacturing a cathode region may further comprises manufacturing a metal contact above the cathode contact region to form a cathode electrode via interconnection.

In step 702, the method further comprises manufacturing a first guard ring region of P doping type in the N-type semiconductor layer. The first guard ring region is formed with a first depth and a fist doping concentration. The first guard ring region is in a closed ring shape, such as a circle ring or a square ring shape.

In step 703, the method further comprises manufacturing a second guard ring region of P doping type in the N-type semiconductor layer. The second guard ring region is formed inside the first guard ring region and has a shallower junction depth than the first guard ring region. As a result, the first guard ring region encloses the second guard ring region. And the second guard ring region may have a much narrower shape than the first guard ring region. Forming the second guard ring region further comprises forming a plurality of inner guard stripes. And in one embodiment, the method further comprises adjusting the reverse leakage current and/or the packing density of the Schottky diode by controlling the space among the stripes. When the stripes are placed closer, or in other words, the space among the stripes is smaller, a higher packing density and a lower reverse leakage current may be achieved.

In one embodiment, the first guard ring region and the second guard ring region are formed with ion implantation process. And after the implantation process in steps 702 and 703, an anneal step may be performed to form the guard ring region. The guard ring region may be manufactured in lattice pattern as shown in FIG. 4, or may be manufactured in grid pattern as shown in FIG. 5B.

The method may further comprise adjusting the breakdown voltage of the Schottky diode by controlling the first depth and adjusting the forward current drivability by controlling the second depth. When the first depth increases, the breakdown voltage increases accordingly and when the second depth decreases, the forward current drivability increases accordingly.

And in step 704, a metal layer is formed over the guard ring region and forms a Schottky contact of the Schottky diode. Additional steps such as forming NBL layer, forming field oxide may be performed and are omitted to simplify the description while not deviating from the spirit of the present invention. The manufacturing of the first guard ring region and the second guard ring region in different steps results in that the second guard ring region has a shallower junction depth than the first guard ring region and the first guard ring region encloses the second guard ring region. In one embodiment, the second guard ring region with shallower depth is formed before the first guard ring region.

This method may not be performed with the sequence as shown in FIG. 7. The sequence may be changed. For example, in one embodiment, the second guard ring region with shallower depth is formed before the first guard ring region. In one embodiment, the cathode region is formed after forming the guard ring regions.

The above embodiments relate to N-type Schottky diode devices. However, P-type devices with the opposite doping type are also in spirit of the present invention. In one embodiment, a first doping type is N doping type and a second doping type is P doping type. And in another embodiment, a first doping type is P doping type and the second doping type is N doping type. N doping type is the type that a semiconductor material is doped with either phosphor, arsenic or any other suitable material such that charge is carried by electrons, and a P doping type is the type that a semiconductor material is doped with either boron, aluminum, gallium or any other suitable material such that charge is carried by holes.

The term of "dual guard ring regions" may refer to an integral region. The term of "dual guard ring regions" means that the guard ring region has a pattern such that the guard ring region intervenes with the Schottky interface. The term of "intervene" means that at least one direction can be found from a layout view of a semiconductor device and when dicing the semiconductor device in this direction, three or more guard ring stripes can be found. The term of "second guard ring region" or "inner guard ring region" does not imply that the second guard ring region or the inner guard ring region itself has a ring shape, rather, it means that "second guard ring region" or "inner guard ring region" comprises part of the entire guard ring region.

Figure 1:
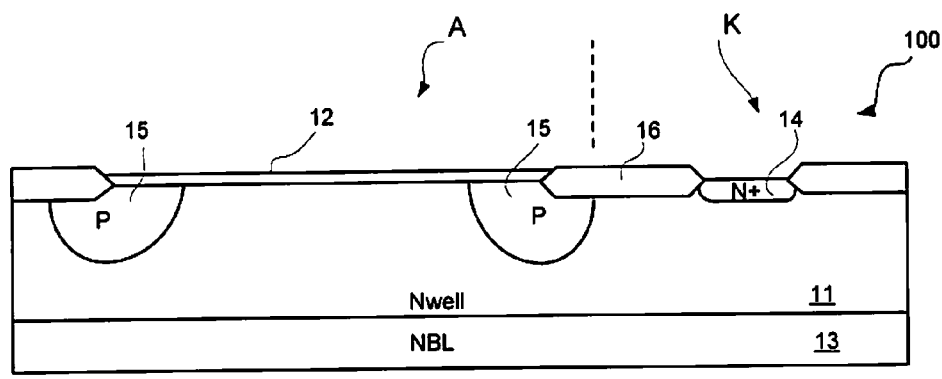
FIG. 1 shows a conventional Schottky diode with a guard ring region as a prior art.
Figure 2:
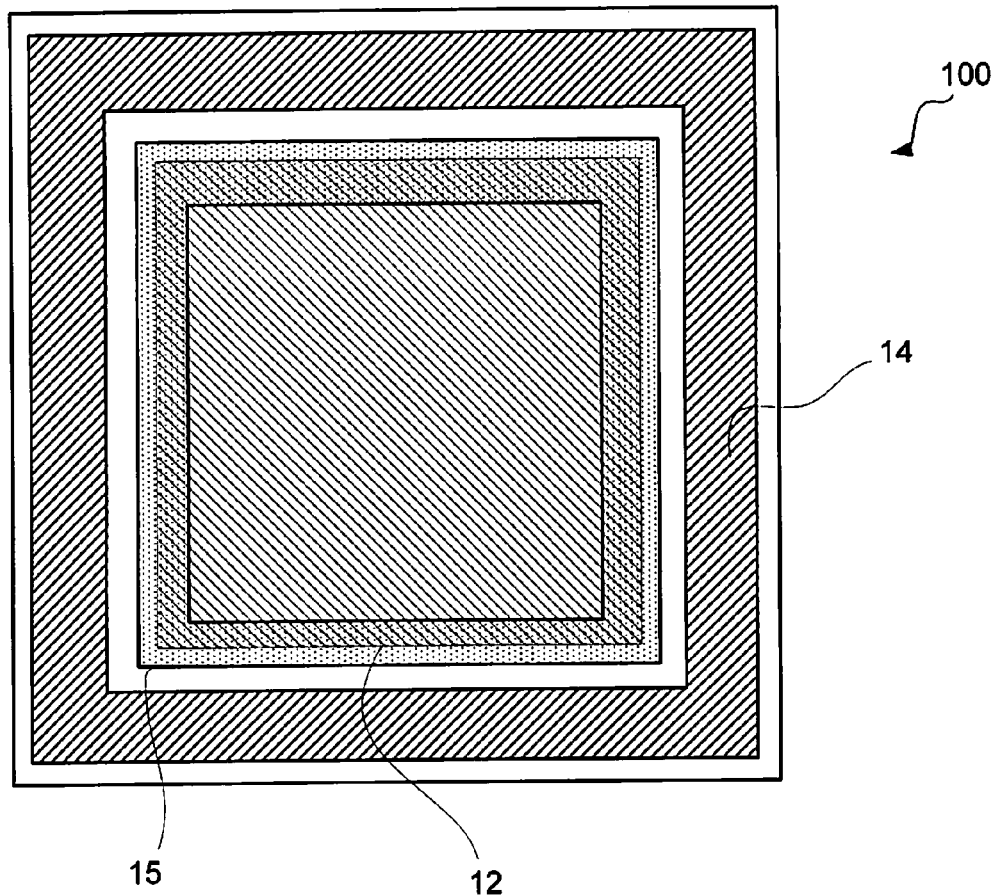
FIG. 2 shows a layout diagram of the conventional Schottky diode in FIG. 1 as a prior art.

In one experimental example, for a TiSi Schottky diode (the metal contact is Titanium and the semiconductor body is Silicon), with the conventional guard ring region as shown in FIG. 1, it has a breakdown voltage of 33 Volts and has a forward current to reverse current ratio of 9. While with the dual guard ring regions as illustrated in FIG. 6, the Schottky diode having the same space area with the Schottky diode in FIG. 1 achieves a breakdown voltage of 59 Volts and a forward current to reverse current ratio of 165. Thus, the proposed solution may achieve a much more efficient and much smaller Schottky diode at a given current drivability. The above experimental example is for illustrative purpose only, and the feature(s) or advantage(s) the above example disclosing or implying comprise only part of the features and advantages pertaining to the present technology. Sometimes, the feature(s) or advantage(s) as illustrated in the experimental example can not be shown in other instances since the result(s) may be affected by other factor(s) which may not be disclosed herein.

While the above Detailed Description describes certain embodiments, the present invention is not limited to the features described and may be practice in many ways. Details of the system may vary in implementation, while still being encompassed by the present invention disclosed herein. Accordingly, the scope of the present invention encompasses not only the disclosed embodiments, but also all equivalent ways of practicing or implementing the present invention under the claims.

I claim:

1. A semiconductor device, comprising:
   a semiconductor layer of a first doping type;
   a guard ring region, in the semiconductor layer, wherein the guard ring region is of a second doping type, and wherein the guard ring region comprises:
      a first guard ring region; and
      a second guard ring region, wherein the first guard ring region encloses the second guard ring region and wherein the second guard ring region has a shallower junction depth than the first guard ring region;
   a Schottky contact, over the guard ring region; and
   a cathode contact region, in the semiconductor layer and the cathode contact region having a first doping type, wherein the cathode contact region is outside of the guard ring region.

2. The semiconductor device of claim 1, wherein the second guard ring region comprises a plurality of stripes.

3. The semiconductor device of claim 1, wherein the first guard ring region comprises a closed ring shape and wherein the second guard ring region comprises a plurality of parallel inner guard stripes, configured to form the guard ring region in a lattice pattern.

4. The semiconductor device of claim 1, wherein the first guard ring region comprises a closed ring shape and wherein the second guard ring region comprises a plurality of lateral inner guard stripes and a plurality of vertical inner guard stripes, configured to form the guard ring region in a grid pattern.

5. The semiconductor device of claim 1, wherein the cathode contact region encloses the guard ring region.

6. The semiconductor device of claim 1, further comprising a plurality of guard ring regions and a plurality of Schottky contacts, wherein the cathode contact region has a lattice pattern having a plurality of windows, and wherein each of the plurality of guard ring regions is in one of the plurality of windows.

7. The semiconductor device of claim 1, wherein the first guard ring region is at the edge of the Schottky contact.

8. The semiconductor device of claim 1, further comprising a buried layer of a first doping type, wherein the buried layer has a higher doping concentration than said semiconductor layer and wherein the buried layer is formed between a semiconductor substrate and said semiconductor layer.

9. The semiconductor device of claim 1, wherein the Schottky contact comprises a metal.

10. The semiconductor device of claim 1, wherein the first doping type is N type and the second doping type is P type.

11. The semiconductor device of claim 1, further comprising a field oxide between the Schottky contact and the cathode contact region.

12. A Schottky diode, comprising:
    a cathode region;
    an anode region, comprising a metal Schottky contact; and
    a guard ring region, wherein the guard ring region comprises an outer guard ring and a plurality of inner guard stripes inside the outer guard ring, and
       wherein the inner guard stripe has a narrower width than the outer guard ring.

13. The Schottky diode of claim 12, wherein the outer guard ring region comprises a closed ring shape and wherein the inner guard ring region comprises a plurality of parallel inner guard stripes, configured to form the guard ring region in a lattice pattern.

14. The Schottky diode of claim 12, wherein said cathode region has a lattice pattern comprising a plurality of windows, configured to form a plurality of anode region islands, and wherein each anode region island is in one of the plurality of windows.

15. The Schottky diode of claim 12, wherein the cathode region comprises a cathode contact region of a first doping type and a metal contact above the cathode contact region.

16. The Schottky diode of claim 12, wherein the metal Schottky contact is Titanium.

17. A method of manufacturing a Schottky diode, comprising:
    forming a cathode region of a first doping type in a semiconductor layer;
    forming a first guard ring region of a second doping type in the semiconductor layer;
    forming a second guard ring region of a second doping type in the semiconductor layer, wherein the second guard ring is formed with a shallower junction than the first guard ring region, and wherein the second guard ring region is formed inside the first guard ring region; and
    forming a metal Schottky contact.

18. The method of claim 17, further comprising regulating a break down voltage of the Schottky diode through controlling the depth of the first guard ring region.

19. The method of claim 17, further comprising regulating a current drivability of the Schottky diode through controlling the depth of the second guard ring region.

20. The method of claim 19, wherein forming the second guard ring region comprises forming a plurality of stripes, the method further comprising controlling the space among the stripes.

* * * * *